United States Patent [19]
Neal et al.

[11] Patent Number: 5,967,824
[45] Date of Patent: Oct. 19, 1999

[54] MECHANISM FOR INSERTING OR REMOVING I/O CARDS WITH INTERNAL CONNECTORS

[75] Inventors: Danny M. Neal, Round Rock; James R. Taylor, Leander; Walter D. Scott, Austin; Ciro N. Ramirez, Round Rock, all of Tex.

[73] Assignee: International Business Machines Corporation, Armonk, N.Y.

[21] Appl. No.: 09/021,743

[22] Filed: Feb. 11, 1998

[51] Int. Cl.⁶ ........................................ H01R 4/50
[52] U.S. Cl. ............................ 439/342; 439/377; 439/157
[58] Field of Search ............................... 439/64, 157, 159, 439/160, 342, 377, 629, 247, 248

[56] References Cited

U.S. PATENT DOCUMENTS

| | | | |
|---|---|---|---|
| 4,480,884 | 11/1984 | Babuka et al. | 439/260 |
| 4,797,786 | 1/1989 | Belanger, Jr. | 439/377 |
| 5,238,423 | 8/1993 | Hillis et al. | 439/377 X |
| 5,868,585 | 2/1999 | Barthel et al. | 439/342 X |

*Primary Examiner*—Khiem Nguyen
*Attorney, Agent, or Firm*—Volel Emile; James E. Bradley; Andrew J. Dillon

[57] ABSTRACT

A board-handling mechanism for more easily installing and removing boards from motherboards and/or other mountings within system enclosures does not require the removal of the enclosure. The mechanism provides leverage to positively seat and unseat circuit boards mounted into system connectors on the motherboard or other locations within system enclosures. A cable loop connector is provided within the enclosure opposite the opening for engaging the I/O connector on the forward edge of the daughterboard. The cable loop connector is biased to an upper position so that the daughterboard will first seat in the cable loop connector before being lowered and engaged to the motherboard connector.

13 Claims, 5 Drawing Sheets

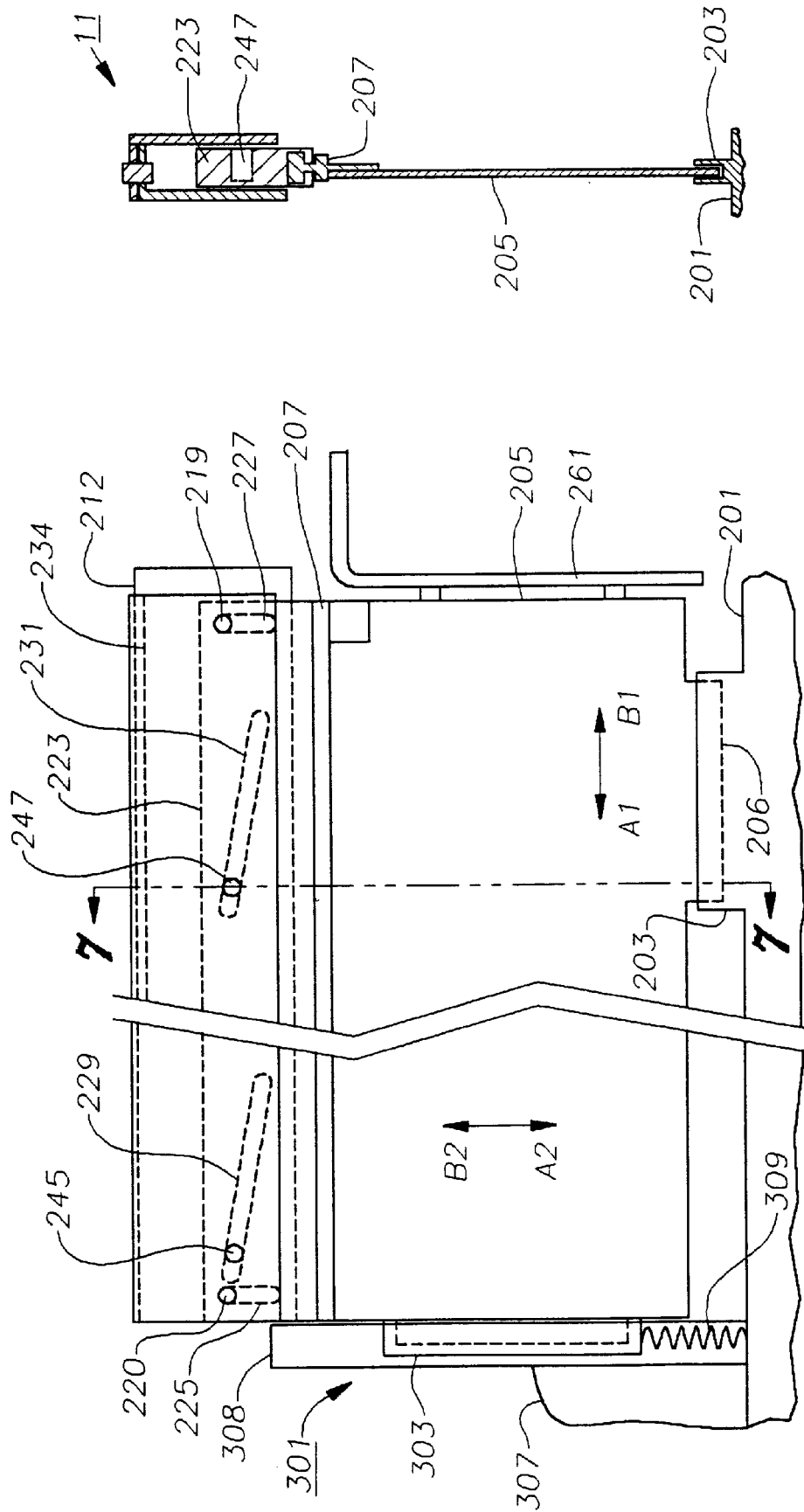

MECHANISM FOR INSERTING OR REMOVING I/O CARDS WITH INTERNAL CONNECTORS

CROSS-REFERENCE TO RELATED APPLICATION

A related application Ser. No. 08/859,448 entitled, Locating and Guidance Device For Printed Circuit Boards, filed May 16, 1997, and assigned to the assignee of the present application, is incorporated by reference.

TECHNICAL FIELD

The present invention relates generally to printed circuit boards and enclosures therefor, and more particularly to an improved circuit board insertion and extraction mechanism for use in installing and removing circuit boards, such as standard PCI I/O adaptor add-in boards, from system enclosures.

BACKGROUND ART

In computer systems, workstations and other electronics-intensive products and systems, ICs (integrated circuits) including processors, memory systems, controllers, logic circuits together with other system components and ASICs (application specific integrated circuits) are generally mounted on circuit boards within a system enclosure. The circuit boards are, in turn, generally coupled to connector terminals on a main system board or motherboard. The motherboard is typically positioned adjacent to, and mechanically supported by, one of the two major walls or panels of an enclosure. The motherboard is typically the largest board in the enclosure, and provides a stable support base for smaller circuit boards or so-called daughter boards, which may be inserted into connectors mounted on the motherboards.

In the prior art, a circuit board was installed into an enclosure by removing the main panel or wall of the enclosure in order to provide access to the connector on the motherboard and also to give an installer the leverage required to apply an in-line force to make certain a solid electrical connection is established and the daughterboard is securely connected. Even as systems are upgraded, and/or new functions or additional functions are implemented on new boards which need to be installed in existing systems and enclosures, or when boards need to be removed for troubleshooting or maintenance, a main panel or side of the electronics system enclosure needs to be fully removed.

In most system environments space is critical. In systems or network environments or host-terminal systems, servers or computer enclosures are usually mounted in close quarters or even in cabinets or equipment racks where access is extremely limited. In such environments, board replacement or installation is a major task since the enclosure needs to be brought out to an open area and one of the main panels has to be removed in order to have access to the motherboard and connectors within the electronics enclosure. In some cases, the server unit may be mounted on a slidable tray support and the server may be slidably removed from its normal operating position, but even in that case, a major panel of the enclosure must be removed to gain access to the enclosed circuit boards.

For circuit boards which must engage connectors on two of its perpendicular edges, usually the forward and lower edges, the problem is more advanced. Each of the connectors must be individually engaged with a significant amount of insertion force to properly seat. With the system enclosure in place, manipulating the circuit board and applying sufficient force to join the connectors is difficult.

DISCLOSURE OF THE INVENTION

One board-handling mechanism for more easily installing and removing boards from motherboards and/or other mountings within system enclosures, referenced above, does not require the removal of the enclosure. The mechanism provides leverage to positively seat and unseat circuit boards mounted into system connectors on the motherboard or other locations within system enclosures. A cable loop connector is provided within the enclosure opposite the opening for engaging the I/O connector on the forward edge of the daughterboard. The cable loop connector is biased to an upper position so that the daughterboard will first seat in the cable loop connector before being lowered and engaged to the motherboard connector.

BRIEF DESCRIPTION OF THE DRAWINGS

FIG. 6 is a schematic side view of the guidance device and daughterboard of FIGS. 1 and 2 shown engaged with the I/O connector of FIG. 4.

FIG. 7 is a sectional end view of the guidance device and daughterboard of FIGS. 1 and 2 taken along the line 7—7 of FIG. 6.

BEST MODE FOR CARRYING OUT THE INVENTION

Although the present invention comprises a mechanism for inserting or removing I/O cards into a system enclosure with internal connectors, the invention may be more clearly understood with a thorough discussion of the original equipment locating and guidance device referenced above.

Figure 1:
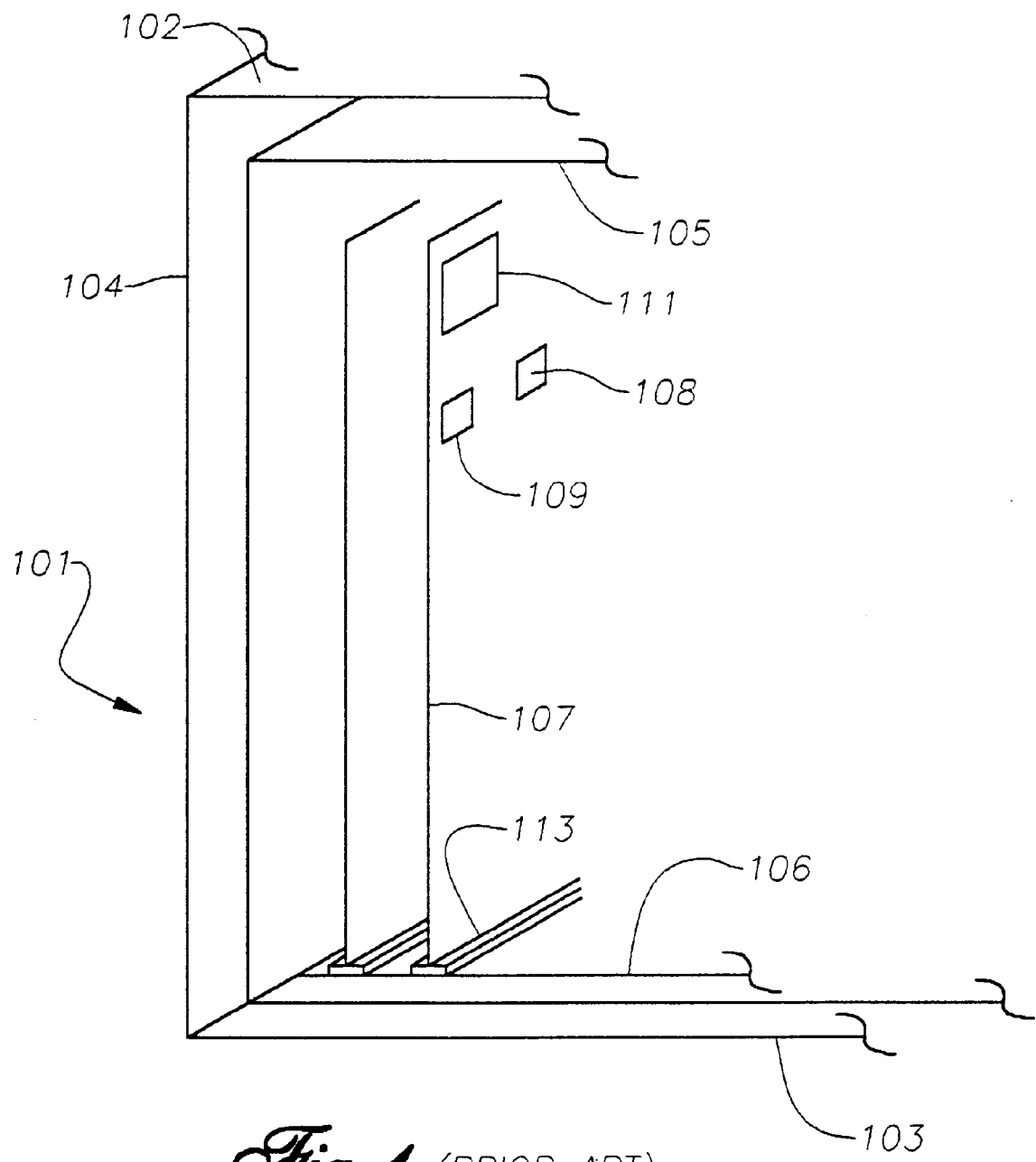
FIG. 1 is a schematic isometric view of a prior art electronics enclosure including a motherboard with daughterboards mounted thereon.

Referring to FIG. 1, a prior art enclosure 101 for housing components of an electronic system, for example, a computer system is shown. The enclosure 101 includes two major panels: a top panel or surface 102 and a base or bottom panel 103. The enclosure 101 also includes four smaller side panels including side panel or surface 104. A frame 105 is located within enclosure 101.

A base circuit board or motherboard 106 is mounted to frame 105. At least one daughterboard 107, such as a standard PCI I/O add-in board, is mounted into a motherboard connector 113 located on motherboard 106 in a prior art manner. Typically, the daughterboards 107 have integrated circuits or ICs, such as IC 108, IC 109 and IC 111 mounted thereon. The integrated circuits may include memory devices, controller circuits, custom chips, ASICs and the like. The individual integrated circuits and other components mounted on daughterboards 107 are electrically connected to a board connector on board 107 (in the case of PCI, through a PCI interface chip). The board connector is mechanically and electrically fitted into one of the corresponding connectors 113 on the motherboard 106 within the enclosure 101.

In the prior art illustrated in FIG. 1, when daughterboard 107 needs to be pulled from enclosure 101 for replacement or upgrading, the main cover 102 of the system enclosure 101 must be removed to gain access to daughterboards 107. To remove daughterboard 107, it must be pulled in an upward direction to free the daughterboard electrical connector from its corresponding connector 113 on the motherboard 106. In order to insure a solid electrical connection between the motherboard 106 and daughterboard 107, the fit of the daughterboard connector and the motherboard connector is relatively tight and requires a significant amount of force (approximately 15 pounds) to insert or extract daughterboard 107 from its connection on the motherboard. The need for this significant force typically requires the removal of a portion of or the entire top panel 102 from the electronics enclosure 101 to provide room to gain mechanical leverage in installing or removing daughterboards 107.

Figure 2:
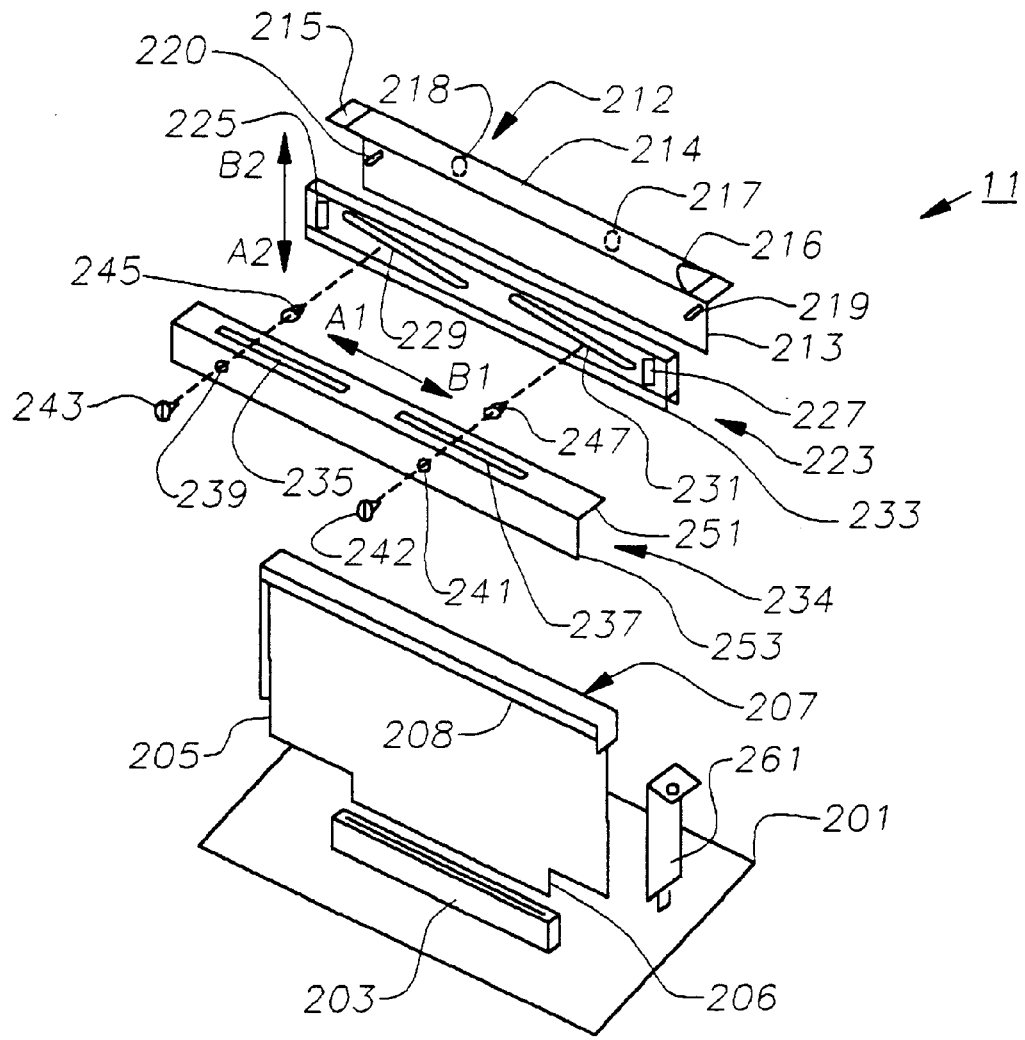
FIG. 2 is an exploded isometric view of a guidance device which is utilized in conjunction with the present invention.

Referring now to FIG. 2, a daughterboard locating and guidance device 11 which is useful in locating, properly aligning, and inserting or removing daughterboards 107 from motherboards is shown. This apparatus permits access to daughterboards 107 from side panels of enclosure 101 (FIG. 1) to insert and remove daughterboards 107 from enclosure 101 without the need for removing a major enclosure panel or transporting the entire enclosure from its operating location to a shop for disassembly.

Guidance device 11 includes a base member 212, an actuating member 223, a slide member 234 and a card frame member 207. A motherboard 201 has a motherboard connector 203 which is arranged to receive, and electrically connect with a matching connector 206 on daughterboard 205. In one embodiment, motherboard connector 203 is a multi-pin electrical connector. A card frame member 207 is removably clipped on to the daughterboard 205. The frame 207 may be designed in one of several ways, to provide a "clipping-on" function such that the frame may be selectively "snapped-on" or "snapped-off" from an upper edge or multiple edges of a standard card or daughterboard 205 in a manner to allow use of standard I/O boards such as PCI I/O boards. The card frame member 207 further includes a groove 208 which runs along each side of the card frame 207 near the top of the frame. The grooves 208 are positioned parallel to the top of the card frame 207. The grooves 208 are arranged to be selectively coupled to a corresponding gripping device 233 located along the bottom of an actuating member 223 as is hereinafter explained. Other coupling devices may also be used to accomplish the slidable attaching or coupling function.

Figure 3:
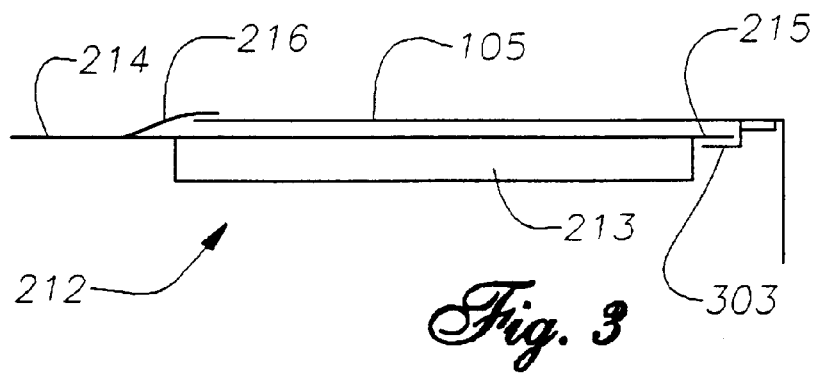
FIG. 3 is a schematic side view of the enclosure of FIG. 1 and an upper end of the guidance device of FIG. 2 which may be used in conjunction with the present invention.

The base member 212 has a side wall 213 and a top surface 214. The top surface 214 further includes a locking tab 215 and a locking clip 216 formed thereon for selective engagement with corresponding locking devices on the frame 105 as shown in detail in FIG. 3. The base member 212 has vertical alignment pins 219 and 220 which are arranged to engage with corresponding vertical alignment slots 227 and 225 of an actuating member 223. The base member 212 also includes first and second horizontal guide pins or bosses 217 and 218 which are arranged to engage with corresponding engagement slots 237 and 235, respectively, of a slide member 234. The actuating member 223 includes first and second follower guide slots 229 and 231 which are downwardly sloping slots relative to the main horizontal axis of the actuating member 223.

The slide member 234 includes first and second guide followers 245 and 247 which are secured to the slide member 234 by means of screws 242, 243 or the like. Screws 242, 243 extend through alignment holes 241, 239 and connect the guide followers 245, 247 to the slide member 234. Guide slots 229, 231 and guide followers 245, 247 provide proper alignment of daughterboard connector 206 with corresponding motherboard connector 203 in a direction which is perpendicular to the planar surface of motherboard 201. This mechanism avoids skewing of daughterboard 205 relative to connector 203. As illustrated, the edge 251 of the slide member 234 will slide near the side wall 213 of the base member 212 above the pins 219 and 220 as slide member 234 is moved along its longitudinal axis in inserting and extracting a daughterboard 205.

An ISA I/O bracket 261 is arranged to have the card side of the bracket 261 connected to the daughterboard 205. Bracket 261 is connected in a conventional manner with rivets, screws or the like, which are fastened through tabs (not shown) located on bracket 261 to the non-conductive substrate body of the daughterboard 205. Bracket 261 is connected on a rearward or B1 side edge of daughterboard 205 which is perpendicular to connector 206.

Figure 8:
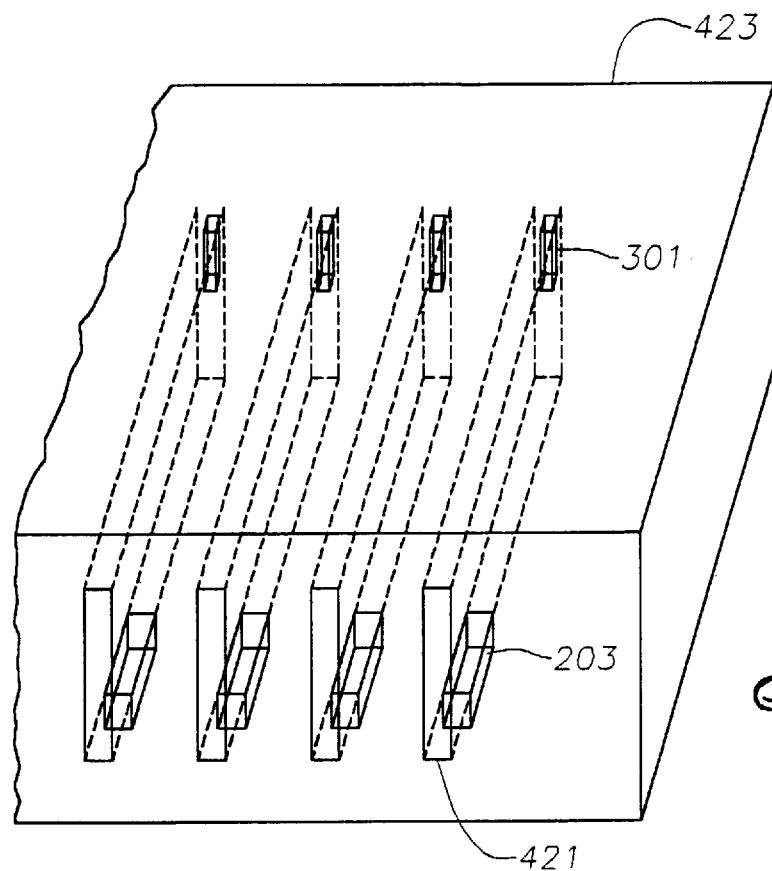
FIG. 8 is an schematic view of an enclosure which is configured with a plurality of access slots, connectors and gripper mechanisms.

Bracket 261 is arranged to be grounded to the system bulkhead 421 (FIG. 8) on the outside of an enclosure 423 to provide improved EMI shielding when daughterboard 205 has been inserted into motherboard connector 203 within enclosure 423. As daughterboard 205 is moved into its connected position, the I/O bracket 261 is arranged to slide along the outside of enclosure opening 421 provided to receive daughterboard 205. In systems designed for autodocking of PCI cards, the bulkhead or enclosure openings 421 are also redesigned to allow insertion of a plurality of the daughterboards 205 without having to remove enclosure 423. In addition, the bulkhead opening 421 is designed to allow enclosure 423 to provide EMI shield grounding. This approach to EMI shielding allows EMI to be grounded to an outer surface of the bulkhead instead of to an inner surface as is currently done.

Referring again to FIG. 3, the base member 212 is engaged with frame structure 105. The locking tab 215 of the base member 212 is engaged with a holding bar 303 which is shown attached to the frame structure 105. In a similar manner, the locking clip 216 of the base member 212 is slipped over the top of the frame structure 105, thereby locking the base member 212 into a fixed position relative to the frame structure 105. The holding bar 303 is mounted on the frame structure 105 directly above a connector 203 (FIG. 2) on motherboard 201 in order to ensure that daughterboard 205 will be properly aligned with connector 203 when daughterboard 205 is inserted using guidance device 11. The holding bar 303 and frame structure 105 comprise a support means for supporting guidance device 11 relative to motherboard connector 203 and enclosure 101.

Figure 4:
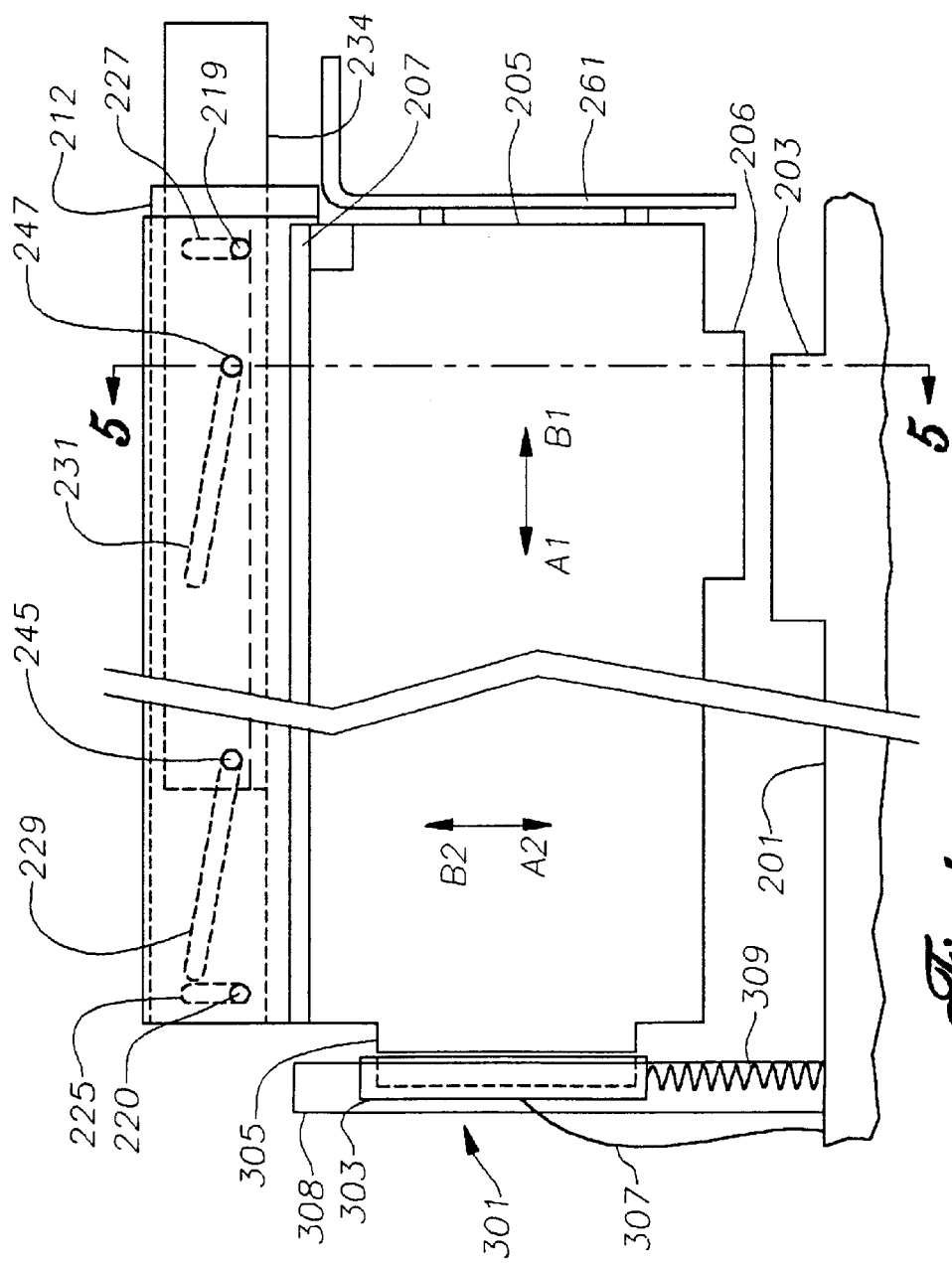
FIG. 4 is a schematic side view of the guidance device and daughterboard of FIGS. 1 and 2 shown prior to engaging an I/O connector constructed in accordance with the invention.

Referring now to FIGS. 4 and 6, a docking or cable loop connector 301 has a connector housing 303 for engaging a conventional I/O connector 305 on a first edge of daughterboard 205. In one embodiment, cable loop connector 301 is a multi-pin electrical connector which faces opening 421 in enclosure 423. Cable loop connector 301 is movable between a disengaged or upper position (FIG. 4) and an engaged or lower position (FIG. 6). A connector guide or track 308 is provided for performing this function. Track 308 limits the movement of cable loop connector 301 in a direction which is normal to base 103 and ensures that connector 301 is facing toward opening 421. Cable loop connector 301 is slidably carried by track 308 between the disengaged and engaged positions. In the embodiment shown, track 308 is stationarily mounted to and extends upward from motherboard 201 in a direction which is normal to base 103. However, track 308 may also be rigidly supported by frame 105 or guidance device 11 to keep it aligned with connector 305 at all times. In FIG. 4, cable loop connector 301 is shown uninserted or disengaged with connector 305. An electronic cable 307 is connected to and extends between connector housing 303 and motherboard 201. Cable loop connector 301 is biased to its upper position with spring 309. Alternatively, connector 301 may be held in its upper position by a detent mechanism (not shown). In its default, upward-biased position, cable loop connector 301 is positioned to align with I/O connector 305 for engagement. FIG. 6 depicts an inserted or engaged position between cable loop connector 301 and I/O connector 305.

In operation, guidance device 11 provides a positional reference between cable loop connector 301, motherboard connector 203 and the various components of guidance device 11. After daughterboard 205 is attached to actuator member 223 and inserted through opening 421 in enclosure 423, connector 305 engages connector housing 303. Slide member 234 slides above the top surface of actuator member 223 so that followers 245, 247 engage slots 229, 231, respectively, thereby forcing actuator member 223 downward. Since actuator member 223 is clipped to card frame 207 and daughterboard 205, daughterboard 205 is forced downward as slide member 234 is pushed inward.

Figure 5:
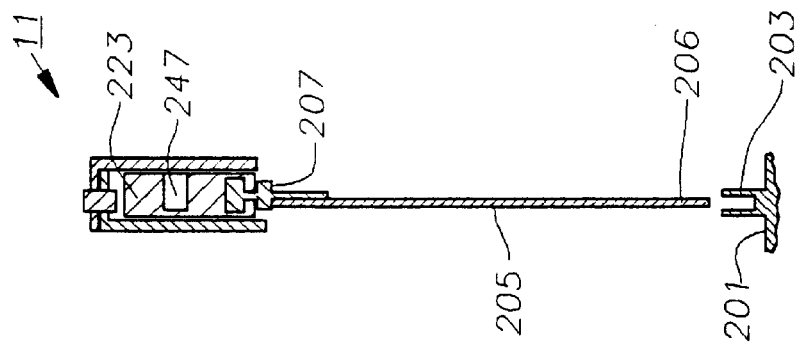
FIG. 5 is a sectional end view of the guidance device and daughterboard of FIGS. 1 and 2 taken along the line 5—5 of FIG. 4.

As shown in FIGS. 2, 6 and 7, moving slide member 234 in direction A1 causes a corresponding movement in the actuating member 223 and daughterboard 205 in direction A2 for insertion of connector 206 into connector 203. Pins 219, 220 of base member 212 limit actuator member 223 to vertical movement. Similarly, movement of slide member 234 in direction B1 causes actuator member 223 to move in direction B2 (FIGS. 2, 4 and 5), thereby aiding in disconnecting connector 206 from connector 203. When cable loop connector 301 is not connected to a daughterboard 205, spring 309 will always bias cable loop connector 301 to the upper position. Guidance device 11 may be detached and removed when daughterboard 205 has been connected to or extracted from connectors 301, 203.

Holding bar 303 (FIG. 3) may be easily installed on the frame structures of new and existing enclosures to allow use of the guidance tool, and card frames are designed to clip on to existing standard circuit cards.

Figure 9:
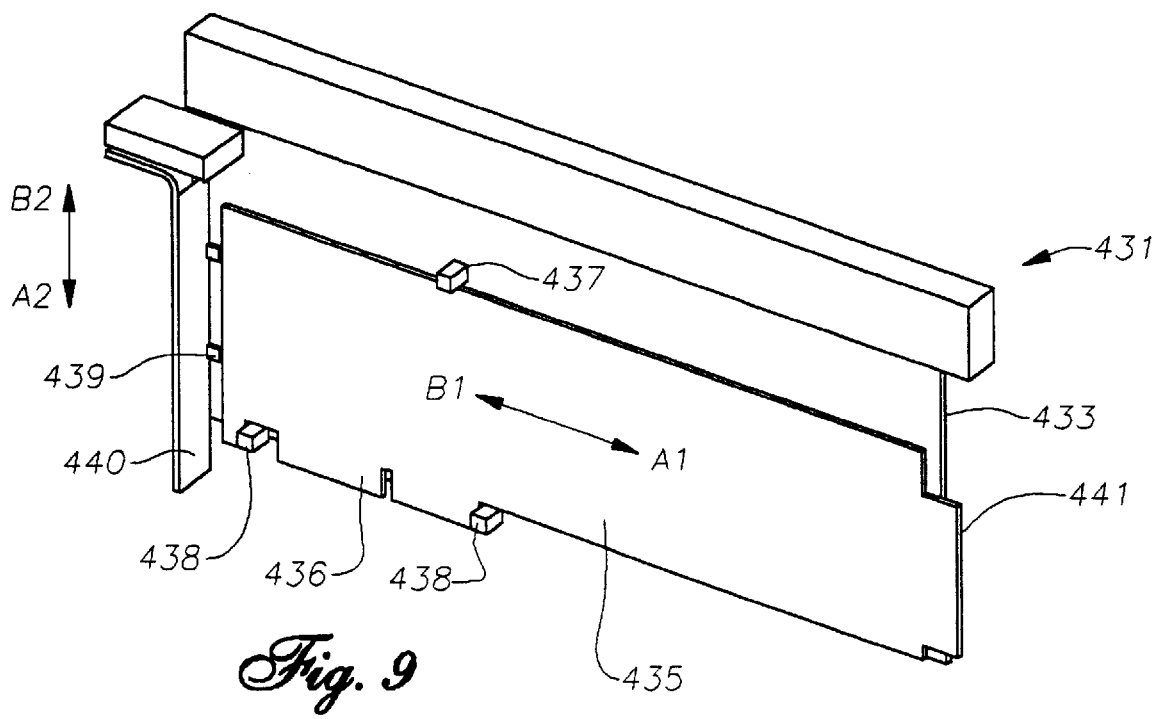
FIG. 9 is an alternate embodiment of a card frame member of the guidance device of FIG. 2.

An alternate embodiment for card frame member 207 is depicted in FIG. 9. A guidance device 431 (shown schematically for simplification) has a large, rigid rectangular support card 433 mounted to a lower end in place of card frame member 207 of guidance device 11. Guidance device 431 is otherwise identical to guidance device 11 described above. Card 433 provides alternate means for mounting a full or near full size daughterboard to guidance device 431. In the embodiment shown, a daughtercard 435 has a motherboard connector 436 on a lower end and an edge connector 441 on a side edge. Daughtercard 435 is mounted to support card 433 with upper and lower clamps 437, 438. Clamps 437, 438 restrict the movement of daughterboard 205 in directions A2 and B2, while clamps 438 restrict its motion in directions A1 and B1. An ISA I/O bracket 440 is mounted to support card 433 and performs the same function as bracket 261, described above.

After daughterboard 435 is pushed into opening 421 in enclosure 423 (FIG. 8), edge connector 441 inserts into card edge connector 301 (not shown) in the same manner as connector 305 engaged connector 301 (FIGS. 4 and 6). Guidance device 431 then lowers daughterboard 435 until connector 436 engages motherboard connector 203 (not shown) as described above. When daughterboard 435 is to be removed, guidance device 431 lifts daughterboard 435 and connector 436 out of connector 203 without the removal of enclosure 423. Connector 441 is disengaged from card edge connector 301 in a manner similar to connector 305. Daughterboard 435 may then be removed from opening 421 and guidance device 431 may be detached and removed.

The invention has several advantages. With the assistance of the guidance device, the daughterboard may sequentially engage and disengage both the cable loop and motherboard connectors without removing the enclosure. The cable loop connector is spring-biased to ensure proper alignment with the daughterboard. In addition, the guidance device disclosed herein may be used with existing enclosures to provide a significant advantage in the alignment, insertion and extraction of daughterboards into corresponding connectors on system motherboards.

While the invention has been shown or described in only some of its forms, it should be apparent to those skilled in the art that it is not so limited, but is susceptible to various changes without departing from the scope of the invention.

We claim:

1. An electrical apparatus for housing a circuit board having a first connector on a base edge and a second connector which is perpendicular to the first connector, comprising in combination:

an enclosure having a base and an opening which is perpendicular to the base;

a motherboard connector mounted in the enclosure and facing in a direction substantially normal to the base, the motherboard connector engaging the first connector when the circuit board is moved toward the base;

a docking connector mounted in the enclosure and being movable between disengaged and engaged positions, the docking connector engaging the second connector when the circuit board is inserted through the opening of the enclosure, and the docking connector moving toward the base as the circuit board is moved into engagement with the motherboard connector; and a bias member for biasing the docking connector to the disengaged position.

2. The electrical apparatus of claim 1 wherein the bias member comprises a spring.

3. The electrical apparatus of claim 1, further comprising a removable guidance device mounted in the enclosure for guiding and aligning the first connector into engagement with the motherboard connector and the second connector into engagement with the docking connector.

4. The electrical apparatus of claim 1 wherein the docking connector and the motherboard connector are multi-pin electrical connectors.

5. The electrical apparatus of claim 1 wherein the docking connector faces the opening in the enclosure.

6. The electrical apparatus of claim 1, further comprising a track stationarily mounted in the enclosure normal to the base; and wherein the docking connector is slidably carried by the track between the disengaged and engaged positions.

7. An electrical apparatus for housing a circuit board having a first connector on a base edge and a second connector which is perpendicular to the first connector, comprising in combination:

an enclosure having a base and an opening which is perpendicular to the base;

a multi-pin electrical motherboard connector mounted in the enclosure and facing in a direction parallel to and away from the base, the motherboard connector engaging the first connector when the circuit board is moved toward the base;

a multi-pin electrical docking connector mounted in the enclosure and facing toward the opening in the enclosure, the docking connector being movable between disengaged and engaged positions and engaging the second connector when the circuit board is inserted through the opening of the enclosure, and the docking connector moving toward the base as the circuit board is moved into engagement with the motherboard connector;

a bias member for biasing the docking connector to the disengaged position;

a removable guidance device mounted in the enclosure for guiding and aligning the first connector into engagement with the motherboard connector and the second connector into engagement with the docking connector;

a track stationarily mounted in the enclosure normal to the base; and wherein the docking connector is slidably carried by the track between the disengaged and engaged positions.

8. The electrical apparatus of claim 7 wherein the bias member comprises a spring.

9. The electrical apparatus of claim 7 wherein the track limits movement of the docking connector to a direction which is normal to the base.

10. The electrical connector of claim 7 wherein the guidance device has a support card to which the circuit board is mounted.

11. A method for mounting a circuit board inside an enclosure of an electrical system, the circuit board having a first connector on a base edge and a second connector which is perpendicular to the first connector, the enclosure having a base and an opening which is perpendicular to the base, comprising:

(a) providing a motherboard connector and a docking connector each of which is mounted within the enclosure, the docking connector facing the opening and being biased to a disengaged position, and the motherboard connector facing away from the base;

(b) inserting the circuit board through the opening of the enclosure until the second connector engages the docking connector;

(c) moving the circuit board toward the base so that the first connector engages the motherboard connector while the docking connector moves from the disengaged position toward the base to an engaged position.

12. The method of claim 11 wherein the circuit board may be removed from the enclosure by reversing steps (b) and (c).

13. The method of claim 11, further comprising guiding and aligning the first connector of the circuit board into engagement with the motherboard connector and the second connector of the circuit board into engagement with the docking connector with a removable guidance device.

* * * * *